US006036823A

United States Patent [19]

Inoguchi et al.

[11] Patent Number: 6,036,823

[45] Date of Patent: Mar. 14, 2000

[54] DIELECTRIC THIN FILM AND THIN-FILM EL DEVICE USING SAME

[75] Inventors: Kazuhiro Inoguchi, Toyota; Yutaka Hattori, Okazaki; Nobuei Ito, Chiryu; Tomoya Uchida, Kariya; Tadashi Hattori, Okazaki; Koji Noda, Aichi-gun; Hisayoshi Fujikawa, Seto; Shizuo Tokito; Yasunori Taga, both of Nagoya, all of Japan

[73] Assignee: Denso Corporation, Kariya, Japan

[21] Appl. No.: 09/126,101

[22] Filed: Jul. 30, 1998

Related U.S. Application Data

[62] Division of application No. 08/695,609, Aug. 12, 1996, Pat. No. 5,789,860.

[30] Foreign Application Priority Data

| | | | |
|---|---|---|---|
| Aug. 11, 1995 | [JP] | Japan | 7-206246 |
| Jul. 3, 1996 | [JP] | Japan | 8-173700 |

[51] Int. Cl.$^{7}$ .......... C23C 14/34

[52] U.S. Cl. .......... 204/192.15; 204/192.22; 204/192.26

[58] Field of Search .......... 204/192.22, 192.15, 204/192.26, 298.07; 313/509

[56] References Cited

U.S. PATENT DOCUMENTS

| | | | |
|---|---|---|---|
| 3,962,062 | 6/1976 | Ingrey | 204/192.22 |
| 4,670,355 | 6/1987 | Matsudaira . | |
| 4,702,980 | 10/1987 | Matsuura et al. . | |
| 5,192,626 | 3/1993 | Sekiya . | |
| 5,270,267 | 12/1993 | Ouellet . | |
| 5,306,547 | 4/1994 | Hood et al. . | |
| 5,404,075 | 4/1995 | Fujikawa et al. . | |
| 5,480,722 | 1/1996 | Tomonaga et al. . | |
| 5,589,733 | 12/1996 | Noda . | |
| 5,660,697 | 8/1997 | Kawashima et al. | 204/192.22 |

FOREIGN PATENT DOCUMENTS

| | | | |
|---|---|---|---|
| 50-27488 | 3/1975 | Japan . | |
| 54-44885 | 4/1979 | Japan . | |
| 56-52438 | 5/1981 | Japan . | |
| 58-216391 | 12/1983 | Japan . | |
| 1-130496 | 5/1989 | Japan . | |
| 2-301554 | 12/1990 | Japan | 204/192 |
| 4-366504 | 12/1992 | Japan . | |
| 5-347187 | 12/1993 | Japan . | |
| 6-32617 | 2/1994 | Japan . | |
| 7-282979 | 10/1995 | Japan . | |

OTHER PUBLICATIONS

R.G. Wilson et al, "Secondary Ion Mass Spectrometry", Practical Handbook for Depth Profiling and Bulk Impurity Analysis, Jun. 1989, pp. 3.1–1 –3.1–4.

*Primary Examiner*—Nam Nguyen
*Assistant Examiner*—Julian A. Mercado
*Attorney, Agent, or Firm*—Pillsbury Madison & Sutro LLP

[57] ABSTRACT

A thin-film electroluminescent device includes dielectric layers having improved dielectric characteristics. The device is fabricated by forming a first transparent electrode layer of ITO, a first dielectric layer, a luminescent layer, a second dielectric layer, and a second transparent electrode layer of ITO in this order on an insulating substrate. Each of the two dielectric layers is a film constituted by TaSnON. That is, the film includes tantalum, tin, oxygen, and nitrogen.

8 Claims, 11 Drawing Sheets

DIELECTRIC THIN FILM AND THIN-FILM EL DEVICE USING SAME

CROSS REFERENCE TO RELATED APPLICATION

This is a division of application Ser. No. 08/695,609, filed Aug. 12, 1996, now U.S. Pat. No. 5,789,860, which is based upon and claims the benefit of priority of the prior Japanese Patent Applications No. 7-206246 filed on Aug. 11, 1995 and No. 8-173700 filed on Jul. 3, 1996, the contents of which are incorporated herein by reference.

BACKGROUND OF THE INVENTION

1. Field of the Invention

The present invention relates to a dielectric thin film with high performance used in various electronic devices, display devices, light modulator devices, and so on. The invention also relates to a thin-film electroluminescent (EL) device using such a dielectric thin film.

2. Related Arts

In recent years, LSI and display device fabrication techniques have evolved. At the same time, there is an increasing need for thin-film materials having high dielectric constants and good insulation. That is, these thin-film materials are used in high-dielectric-constant capacitors contributing to miniaturization of LSIs and in high-dielectric-constant dielectric films used for large-sized, highly reliable display devices. More specifically, a transparent dielectric film of a high dielectric constant is formed on a transparent substrate. A functional film is formed on the dielectric film. Thus, fabrication of a display device comprising the transparent glass plate is attempted such that characters are made to emerge from the transparent glass in operation. Also, fabrication of an optical modulator device for adjusting the intensity of light transmitted through the glass is attempted. In this way, application of thin-film materials of high dielectric constants has been earnestly studied. Among these various applications, in the field of electroluminescent (EL) devices, there is a need for thin-film materials having higher dielectric constants and good insulation.

Among EL devices, a fully solid-state thin-film EL device is a display device which has excellent durability, self-emitting property, and excellent visibility. This solid-state thin film EL device has been put into practical use as a flat panel display. Furthermore, a thin-film EL device uses a pair of electrodes each made of a transparent conductive film, whereby a transmissive type light-emitting device can be built. In this manner, thin-film EL devices are highly promising light-emitting devices and expected to find wide application.

A very high alternating electric field is applied to the thin-film EL device because of the principle of operation of the device. Therefore, the thin-film EL device has the disadvantage that the dielectric breakdown of the dielectric layer of high dielectric constant limits the life of the EL device. Accordingly, if a thin film having a high dielectric constant and good insulation can be formed in the thin-film EL device, then long life can be imparted to the device. Also, the device can be made to emit stably and efficiently. As a result, thin-film EL devices can be manufactured with improved yield. Also, the area of the emitting surface can be increased.

In the past, dielectric films of the above-described thin-film EL device have been made of silicon dioxide, alumina, silicon nitride, yttrium oxide, and other materials. Since dielectric films made of these materials have small relative dielectric constants, it is impossible to apply an effective voltage to the light-emitting layers. Hence, a higher driving voltage is required. Furthermore, it has been attempted to fabricate a dielectric layer for use in the thin-film EL device from tantalum oxide whose relative dielectric constant is 5 or 6 times as high as that of silicon oxide. However, if thin films of tantalum oxide and transparent conductive films as consisting of ITO (indium tin oxide) are stacked on top of each other, then the dielectric strength deteriorates drastically. Accordingly, methods for making a multilayer dielectric structure by placing a thin film of silicon dioxide, alumina, silicon nitride, yttrium oxide, or other material at the interface between a dielectric film of tantalum oxide and a transparent conductive film have been proposed (Japanese Patent Laid-Open Nos. 50-27488, 54-44885, 56-52438, and 58-216391). Nevertheless, these multilayer dielectric films have failed to yield great advantages. Furthermore, complicated manufacturing steps have been necessitated.

It has also been attempted to fabricate a thin film of improved dielectric strength by adding yttrium oxide, tungsten oxide, or other material to a film of tantalum oxide (Japanese Patent Laid-Open No. 4-366504). Indeed, the dielectric strength of the dielectric thin film can be improved, but the aforementioned problem remains to be solved, i.e., if these dielectric thin films and transparent conductive films made of ITO or the like are laminated on top of each other, then the dielectric strength drops drastically.

SUMMARY OF THE INVENTION

In view of the foregoing problems with the prior art techniques, the present invention has been made.

It is an object of the present invention to provide a dielectric thin film which is not composed of plural layers but consists of a single layer, exhibits a high relative dielectric constant, and, when stacked together with a transparent conductive film, does not suffer from a deterioration of the dielectric strength.

It is another object of the invention to provide a thin-film electroluminescent device using the dielectric thin film described in the immediately preceding paragraph.

The inventors first assumed that either diffusion of oxygen or metal from transparent conductive films into depletion layers existing in thin films of tantalum oxide or diffusion of oxygen contained in the tantalum oxide films into the transparent conductive films causes a decrease in the dielectric strength of the tantalum oxide thin films which are stacked on top of each other together with the transparent conductive films. Then, the inventors have considered that the depletion layers in the tantalum oxide films can be passivated and the diffusion of oxygen in the tantalum oxide films can be suppressed by adding other element to the tantalum oxide. For this purpose, the inventors first thought that it was necessary to pay attention to the constituent elements of the transparent conductive films. On this assumption, the inventors added various compounds such as indium oxide and tin oxide to tantalum oxide and fabricated thin films. The inventors have discovered that even if these thin films are formed on transparent conductive films as consisting of ITO, the films show good insulation and have high dielectric constants of approximately 20.

In an attempt to use these composite thin oxide films as dielectric films in a thin-film EL device, the inventors made further studies, using a sputtering machine with a single target. The inventors have found that increases in the electrical resistance of the ITO should be prevented more effectively, and that the dielectric characteristics should further be improved.

Accordingly, it is a further object of the present invention to provide a dielectric thin film which has improved dielectric characteristics and which can prevent increases in the electrical resistance more effectively than heretofore when laminated on transparent conductive films of ITO.

The above objects are achieved in accordance with the teachings of the invention by an amorphous dielectric thin film substantially consisting of (i) tantalum, (ii) at least one of indium and tin, (iii) oxygen, and (iv) nitrogen. Hereinafter, the dielectric thin film is given by TaMON (M=Sn, In). In case the dielectric film includes tin (Sn), the film is represented as TaSnON.

That is to say, a dielectric thin film substantially consisting of tantalum, at least one of indium and tin, and oxygen, i.e., TaMO (M=Sn, In) film, can further be improved in dielectric characteristics by adding nitrogen thereto.

The amorphization of the thin film can suppress leakage and variations of characteristics which would normally be induced by crystal grain boundaries.

Furthermore, in a case where the TaMON film is formed in contact with an ITO layer, increases in the electrical resistance of the ITO can be prevented more effectively for the following reason. The inventors consider that nitrogen fills in oxygen voids in the tantalum oxygen, thus preventing diffusion of oxygen between the tantalum oxide and ITO.

Herein, if the content of nitrogen atoms contained in the TaMON film is 0.5–5.0 at % (atomic percent) with respect to the total content of metal atoms in the TaMON film, or the ratio of the number of nitrogen atoms to the number of atoms of the at least one of indium and tin is 0.1–20.0, desirable dielectric characteristics can be obtained.

Furthermore, in one feature of the invention, such TaMON film is used as a dielectric layer in a thin-film EL device. Since the dielectric layer consisting of the TaMON film has a high relative dielectric constant, the partial voltage applied to the luminescent layer can be increased, and the luminescent threshold voltage can be lowered. Furthermore, the TaMON film has a high dielectric breakdown field strength and so the dielectric breakdown field strength of the thin-film EL device can be enhanced. Also, in case ITO is used as transparent electrodes of the EL device, the electrical resistance of the electrodes can be prevented from increasing even if the TaMON film is in contact with the ITO layer.

Herein, the TaMON film may be disposed on or below a luminescent layer as a single layered dielectric thin film. A film of $SiN_x$ or SiON may also be formed between the luminescent layer and the TaMON film, in which case the luminescent threshold voltage can be regulated.

Furthermore, the invented TaMON film may be used as a passivation film for the ITO layer. In this case, the TaMON film provides moisture-resistance. Also, increases in the electrical resistance of the ITO layer can be prevented.

The above-described dielectric thin film in the thin-film EL device can be fabricated by performing a sputtering operation in a mixed gas atmosphere including argon, oxygen, and nitrogen by the use of a sputtering target comprising tantalum oxide together with at least one of indium oxide and tin oxide. In this case, tantalum oxide is mixed with at least one of indium oxide and tin oxide, and the mixture is sintered, thus forming a sintered mixture sputtering target. Use of this target makes it easy to fabricate the thin-film EL device with a single source sputtering machine.

During the sputtering operation, the TaMON film of high performance can be obtained with high deposition rate by setting the pressure of the mixture gas atmosphere to 0.3 Pa or less. However, if the pressure is very low, it is difficult to obtain a stable plasma. Therefore, the pressure is preferably set to 0.05 Pa or higher.

The electrical resistance of the ITO layer can be prevented from increasing by forming the TaMON film on the ITO layer. In this case, if the ratio of the volume of nitrogen gas contained in the mixture gas to the volume of the mixture gas is set 5 vol % or more, then an appropriate amount of nitrogen atoms can be included. Hence, excellent dielectric characteristics can be provided. Furthermore, increases in the resistance of the ITO layer can be reduced.

In addition, increases in the electrical resistance of the ITO layer can be prevented by setting the volume ratio of the oxygen gas not to be greater than the volume ratio of the nitrogen gas. However, if the volume ratio of the sum of the oxygen and nitrogen gases is 50 vol % or more, it is impossible to sustain stable plasma discharge. Consequently, it is necessary to set the volume ratio of the sum of these gases to be less than 50 vol %.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF PREFERRED EMBODIMENTS

The preferred embodiments of the present invention are hereinafter described by referring to the accompanying drawings.

First Embodiment

Figure 1:
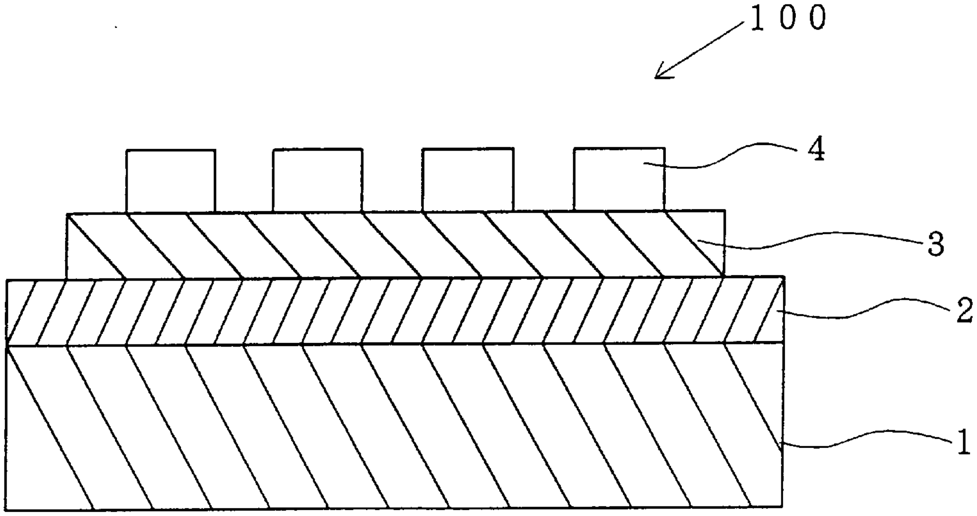
FIG. 1 is a cross-sectional view of a sample of dielectric film showing a first embodiment of the invention, the sample undergoing measurements of performance.

FIG. 1 is a schematic cross section of a sample 100 of a dielectric thin film used for measurements of performance. The sample 100 was fabricated by preparing an insulating substrate 1 made of non-alkaline glass, forming a lower electrode layer 2 consisting of ITO on the substrate 1, forming a dielectric layer 3 on the lower electrode layer 2, and forming an upper electrode layer 4 composed of aluminum (Al) on the dielectric layer 3.

Figure 2:
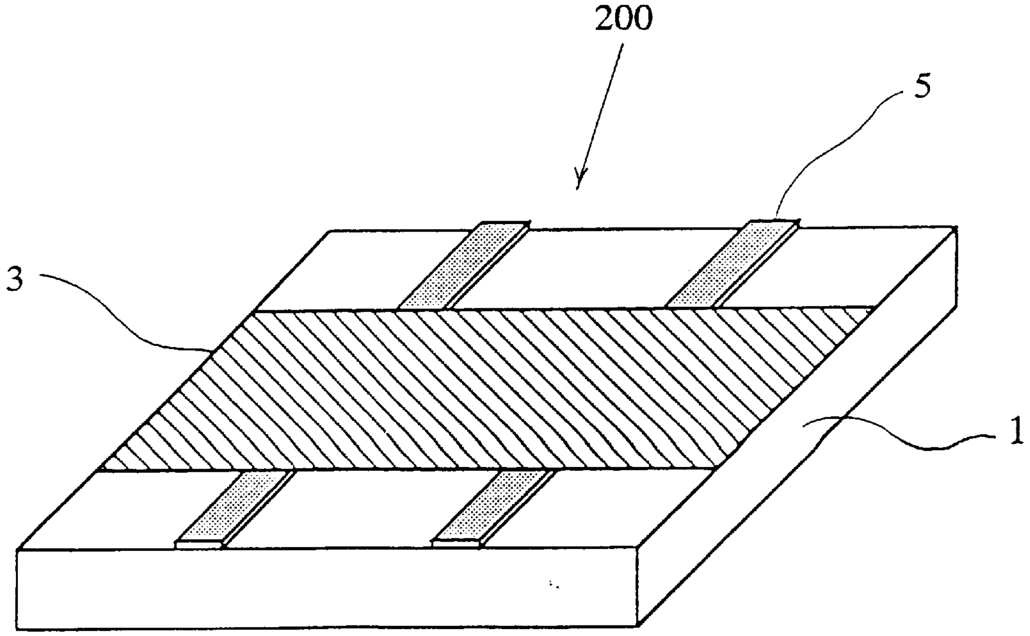
FIG. 2 is a perspective view of a sample used to confirm an increase in the electrical resistance of an ITO layer.

Referring to FIG. 2, there is shown a sample 200 used to check increases in the electrical resistances of the ITO layers. The sample 200 was prepared by forming a striped electrode layer 5 consisting of ITO and the dielectric layer 3 on the insulating substrate 1.

In order to check the effects dependent on various kinds of the dielectric layer 3, the following three kinds a–c of the dielectric layer 3 were formed and they were compared.

The dielectric layer a was the prior art dielectric film of tantalum oxide ($Ta_2O_5$). This tantalum oxide film was formed in the manner described as follows. The glass substrate 1 was heated to 300° C. and maintained at this temperature. The inside of the film formation chamber was evacuated to $1.0\times10^{-4}$ Pa or less. Then, mixture gas consisting of argon (Ar) and 30 vol % oxygen ($O_2$) was introduced into the film formation chamber. The gas pressure was kept at 0.2 Pa. A sputtering operation was carried out with an RF power of 2 KW. At this time, a sintered target consisting of 100% tantalum oxide ($Ta_2O_5$) was used as a sputtering target. The thickness of the formed film was 400 nm.

The dielectric layer b was a dielectric film (TaSnO film) consisting of tin, tantalum, and oxygen. This TaSnO film was formed in the manner described below. The glass substrate 1 was heated to 300° C. and maintained at this temperature. The inside of the film formation chamber was evacuated to $1.0\times10^{-4}$ Pa or less. Then, mixture gas consisting of argon (Ar) and 30 vol % oxygen ($O_2$) was introduced into the film formation chamber. The gas pressure was kept at 0.2 Pa. A sputtering operation was carried out with an RF power of 2 KW. At this time, a sintered mixture target consisting of tantalum oxide ($Ta_2O_5$) together with 10 mol % tin oxide ($SnO_2$) was used as a sputtering target. The sputtering operation was performed with a single target. The thickness of the formed film was 400 nm.

The dielectric layer c was a dielectric film (TaSnON film) consisting of tin, tantalum, oxygen, and nitrogen. Nitrogen gas was introduced into a sputtering atmosphere to form this TaSnON film. The process is described in further detail below. The glass substrate 1 was heated to 300° C. and maintained at this temperature. The inside of the film formation chamber was evacuated to $1.0\times10^{-4}$ Pa or less. Then, mixture gas consisting of argon (Ar), 20 vol % nitrogen ($N_2$), and 5 vol % oxygen ($O_2$) was introduced into the film formation chamber. The gas pressure was kept at 0.2 Pa. A sputtering operation was carried out with an RF power of 2 KW. At this time, a sintered mixture target consisting of tantalum oxide ($Ta_2O_5$) together with 10 mol % tin oxide ($SnO_2$) was used as a sputtering target. The sputtering operation was carried out with a single target. The thickness of the formed film was 400 nm. X-ray diffraction measurements have revealed that the obtained TaSnON film was amorphous in character.

Figure 3:
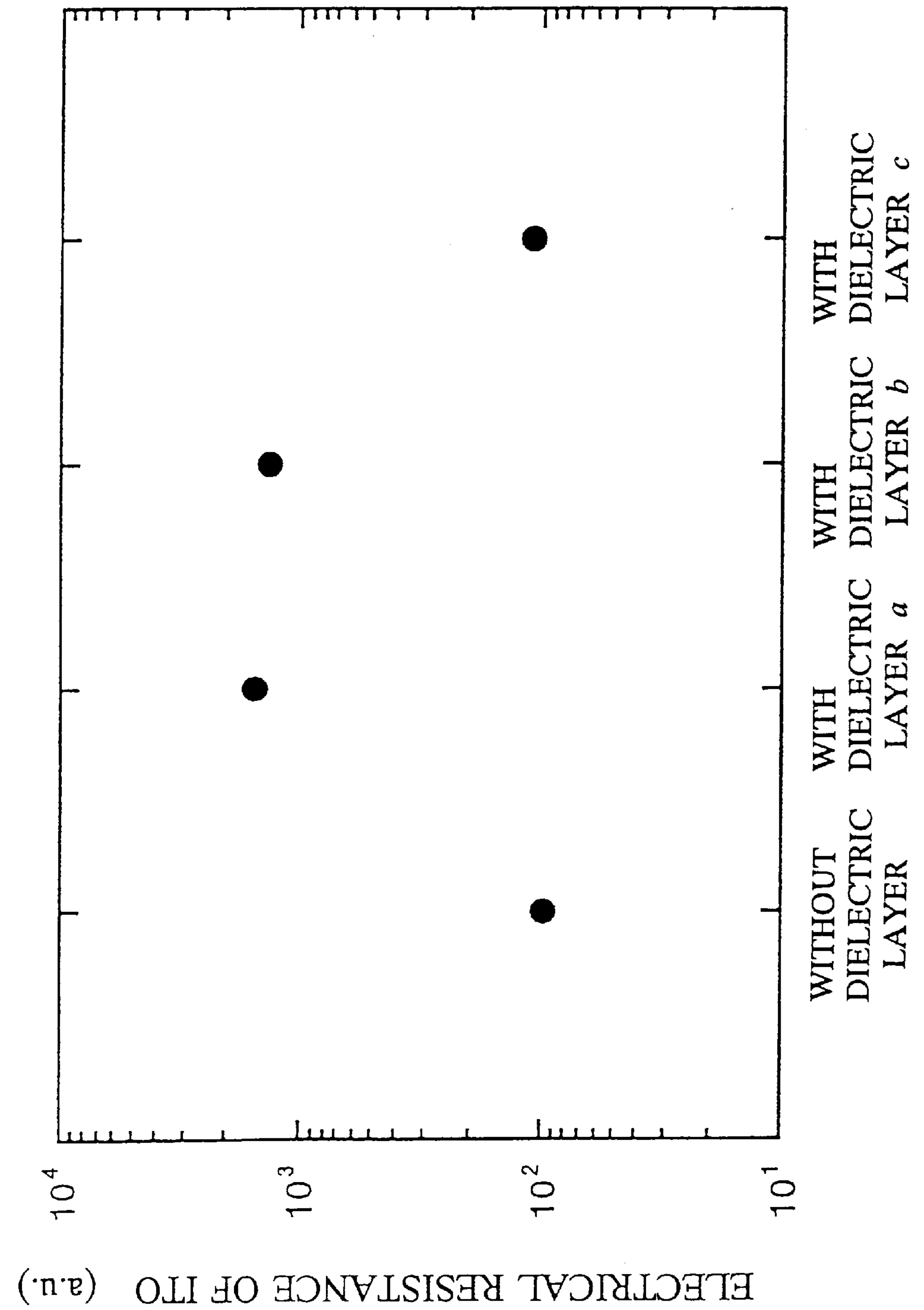
FIG. 3 is a graph in which the electrical resistance values of ITO layers covered with a $Ta_2O_5$ film, a TaSnO film, and a TaSnON film, respectively, are compared.

FIG. 3 shows the resistance values of the opposite ends of the ITO layers in the sample 200. As can be seen. from this graph, in the $Ta_2O_5$ film (dielectric layer a) and the TaSnO film (dielectric layer b), the resistances of the ITO layers increased. On the other hand, in the TaSnON film (dielectric film c) formed by sputtering in a nitrogen atmosphere, the resistance of the ITO layer did not increase. That is, nitrogen is helpful in preventing the ITO resistance from increasing. The inventors understand the mechanism as follows. Nitrogen fills in oxygen voids in the tantalum oxide, thus preventing diffusion of oxygen between the tantalum oxide and ITO.

Figure 4:
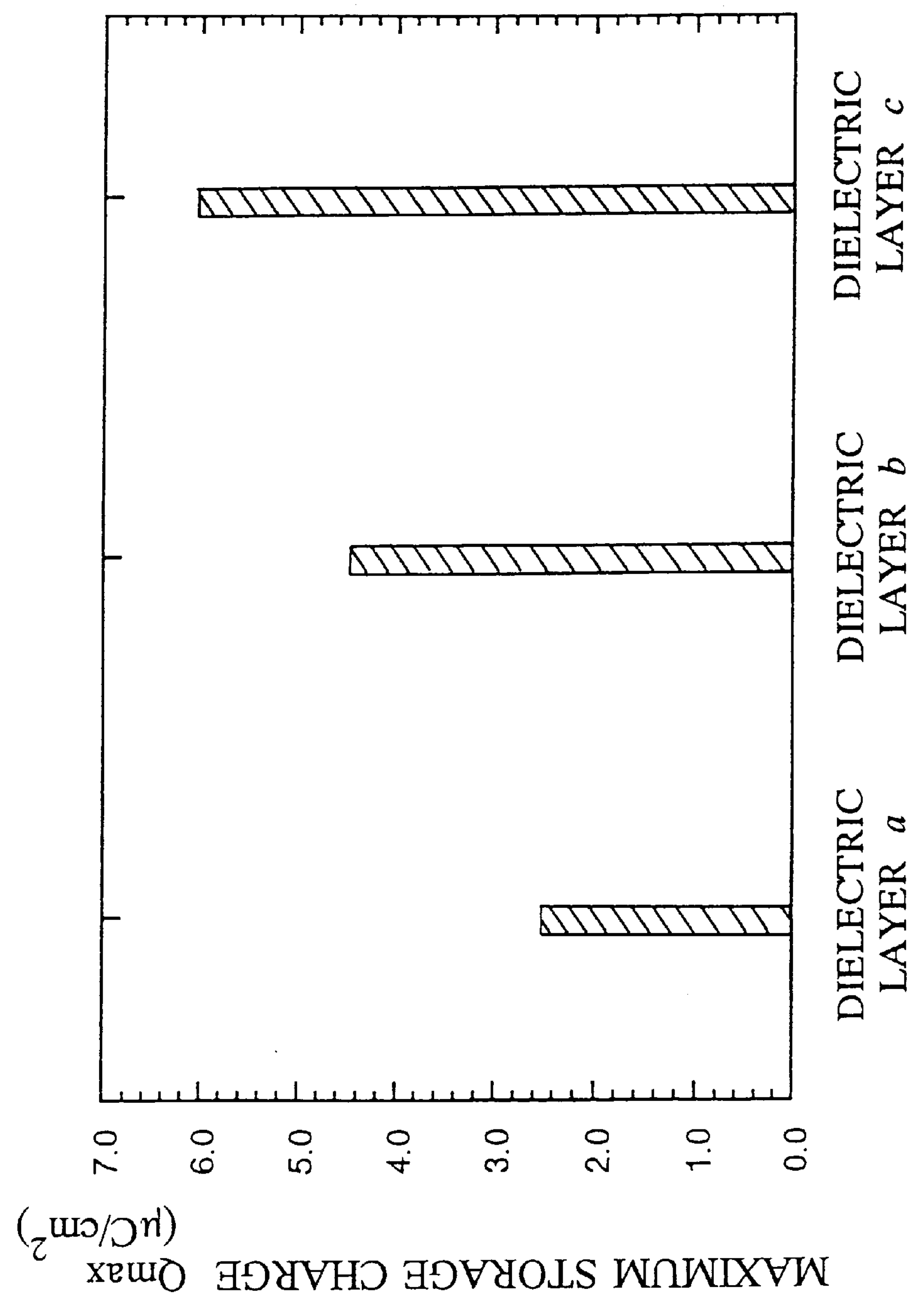
FIG. 4 is a graph in which the maximum amounts of electric charge stored in the $Ta_2O_5$ film, TaSnO film, and TaSnON film, respectively, are compared.

FIG. 4 shows the dielectric characteristics of the sample 100. To compare dielectric films in terms of their performance, the amount of electric charge stored per unit area immediately before the dielectric film under investigation produces dielectric breakdown is used. This is hereinafter referred to as the maximum storage charge Qmax. It can be said that as the maximum storage charge Qmax increases, the performance of the dielectric film is enhanced. The measurements were made, using a sinusoidal wave of 1 KHz. The voltage-stored charge amount characteristics were measured with a Sawyer-Tower circuit.

It can be seen from FIG. 4 that the TaSnO film (dielectric layer b) was superior in performance to the prior art $Ta_2O_5$ film (dielectric layer a). However, the TaSnON film (dielectric film c) undergone sputtering in a nitrogen atmosphere exhibited still higher performance. In case TaSnO was sputtered in an atmosphere containing nitrogen to form a TaSnON film, the film characteristics were quite effectively improved as can be seen from FIG. 4. In this case, the characteristics were less different among plural samples undergone the measurements.

Other samples (having the composition Ta—O—N) of tantalum oxide to which no tin oxide was added was subjected to sputtering in an atmosphere containing nitrogen. Although the characteristics were less different among these samples (not shown), great performance improvement was not observed.

It can be seen from FIG. 4 that the maximum storage charge Qmax stored in the $Ta_2O_5$ film (dielectric layer a), TaSnO film (dielectric layer b), and TaSnON film (dielectric film c) were about 2.5 $\mu C/cm^2$, about 4.5 $\mu C/cm^2$, and about 6.0 $\mu C/cm^2$, respectively. In a case where tantalum oxide to which no tin oxide was added was subjected to sputtering in an atmosphere containing nitrogen, the maximum storage charge Qmax was about 2.8 $\mu C/cm^2$, which is not shown in FIG. 4.

Therefore, in case nitrogen was added to $Ta_2O_5$, an improvement of about 0.3 $\mu C/cm^2$ was achieved. In case nitrogen was added to TaSnO, an improvement of about 1.5 $\mu C/cm^2$ was accomplished. It can be seen that the combined effect of tin and nitrogen improved the dielectric characteristics further.

In the present embodiment, it is assumed that the total amount of tantalum and tin atoms is 100%. The concentration of tin, i.e., the total amount of tin atoms, is 3.7 at %. This concentration of tin should be controlled to be 55 at % or less, preferably 0.4–45 at %. In case the concentration of the added element (in this case, tin) is in excess of 55 at % with respect to the total amount of metal atoms in the TaSnON film, the added element produces greater effects, thus deteriorating the relative dielectric constant and dielectric breakdown field strength. When single source sputtering was carried out, using the sintered mixture target, the concentration of tin in the resultant film was lower than the concentration of the tin in the target by about 10%. Therefore, the concentration of tin in the sintered mixture target is preferably selected to be 0.5–50 at %.

Figure 5:
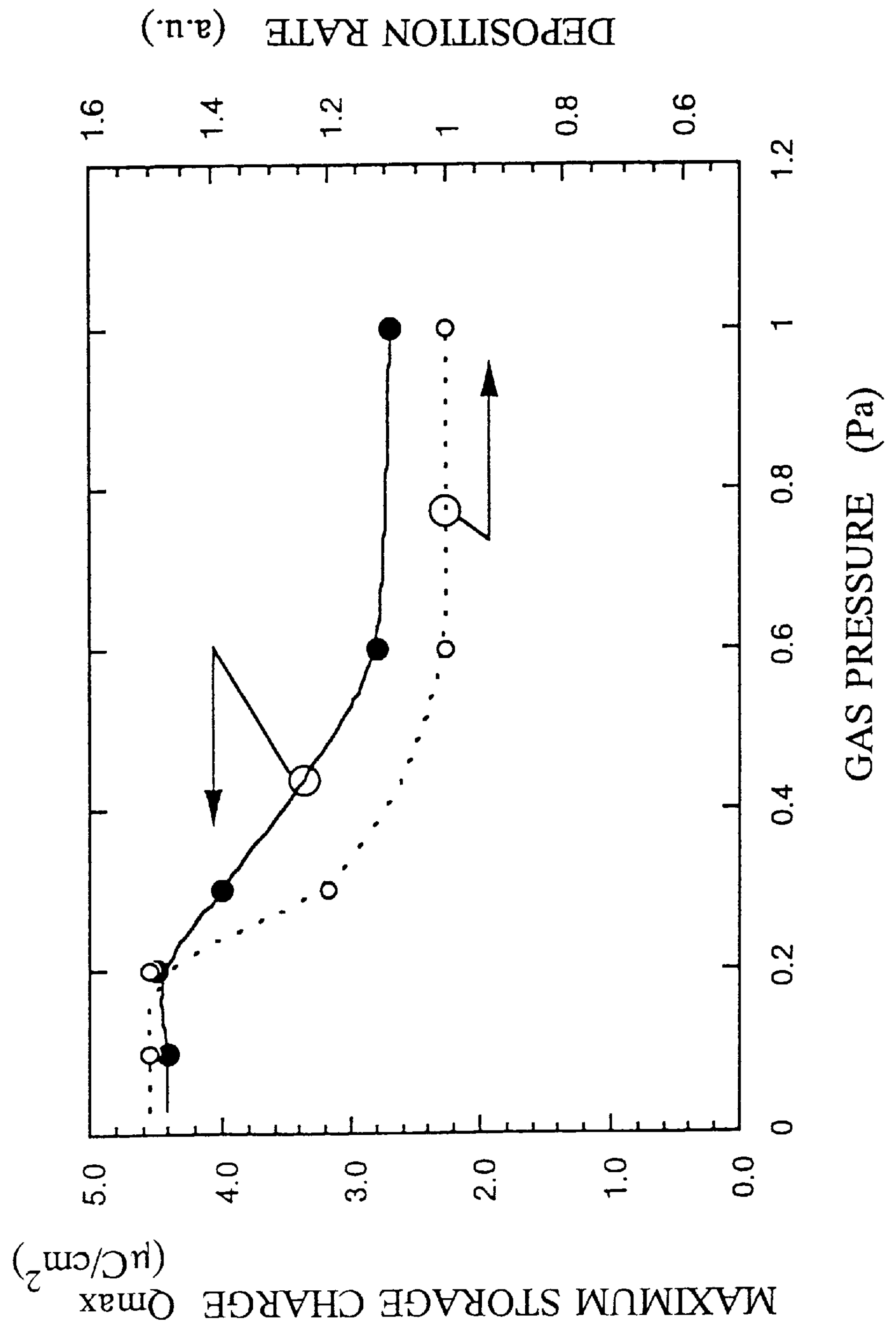
FIG. 5 is a graph showing the relationships among sputtering gas pressure, maximum storage charge, and film deposition rate.

FIG. 5 shows the relations among the pressure of atmospheric gas used for sputtering, the dielectric characteristics of obtained films, and the deposition rate. Mixture gas consisting of argon (Ar), 20 vol % nitrogen ($N_2$), and 5 vol % oxygen ($O_2$) was used as the atmospheric gas. A sputtering operation was effected with an RF power of 2 KW. At this time, a sintered mixture target consisting of tantalum oxide ($Ta_2O_5$) together with 10 mol % tin oxide ($SnO_2$) was used as a sputtering target. The arrows used in the graph indicate side axes along which their respective characteristics should be read.

As can be seen from the graph of FIG. 5, a TaSnO film of higher performance can be obtained quickly by performing sputtering under a lower gas pressure condition. Especially, when the pressure was not greater than 0.3 Pa, conspicuous advantages can be obtained. At the same time, higher dielectric characteristics are derived. When the pressure of the atmospheric gas under which sputtering is done is very low, it is difficult to obtain a stable plasma. Therefore, the sputtering is preferably carried out at a pressure of 0.05 Pa or higher.

Figure 6:
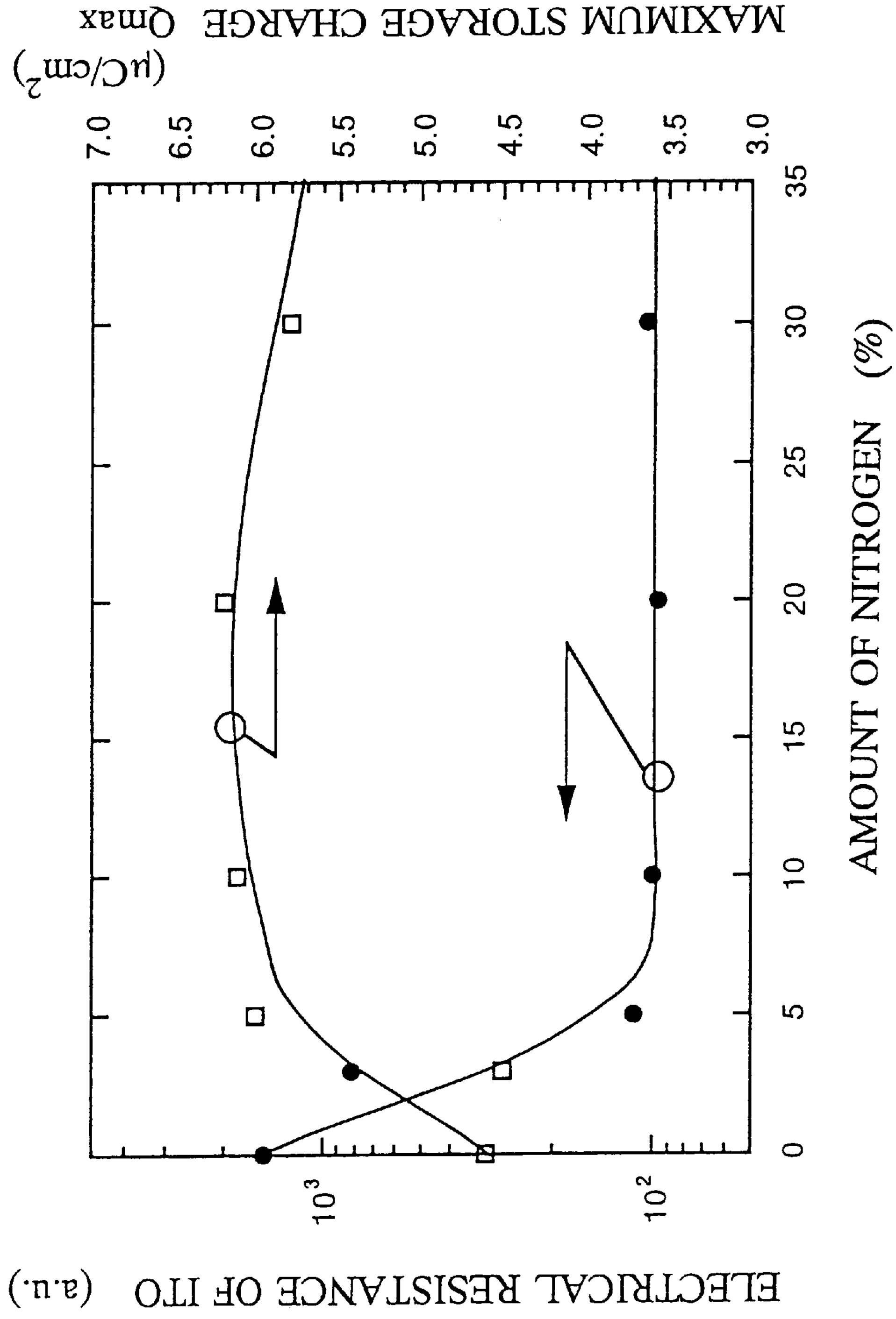
FIG. 6 is a graph showing the relationships among nitrogen concentration, the electrical resistance value of ITO layer, and the maximum storage charge.

FIG. 6 shows the relations among the amount of nitrogen in sputtering gas used when a TaSnON film is formed, variations in the resistance of ITO, and the maximum storage charge Qmax in the formed TaSnON film. As can be seen from this graph, in case the nitrogen content is 5 vol % or more, the resistance of ITO rises to a lesser extent, and better dielectric characteristics are obtained.

In a case where the amount of oxygen in the sputtering gas exceeds the amount of nitrogen, the resistance of ITO may not drop sufficiently. Therefore, it is desired to control both amounts such that the amount of oxygen does not exceed the amount of nitrogen. Furthermore, if the partial pressure of argon contained in the sputtering gas is low, then the deposition rate drops. This makes it impossible to sustain stable discharge in the film formation chamber for a long time. Consequently, the volume percent of the argon should be set to be at least 50 vol %, more preferably 60 vol % or more. This tendency occurs especially conspicuously in a case where sputtering is performed at low pressures of 0.3 Pa or less. If the partial pressure of the argon is not sufficient, then it is highly likely that the discharge comes to a stop. In a case where no oxygen is introduced into the sputtering gas at all, the film may be blackened due to a lack of oxygen. Therefore, it is necessary to introduce at least a trace amount of oxygen into the sputtering gas.

The inventors investigated the composition of the TaSnON film, especially the relation between the concentration of nitrogen in the film and the dielectric characteristics. The results are given below.

The sample 100 (FIG. 1) used for measurements of performance was used for the investigation. In this case, in the same way as the above-described dielectric layer c, the glass substrate 1 was heated to 300° C. and maintained at this temperature. A sintered mixture target consisting of tantalum oxide ($Ta_2O_5$) together with 10 mol % tin oxide ($SnO_2$) was used. A mixture gas containing argon (Ar), oxygen ($O_2$), and nitrogen ($N_2$) at an adjusted ratio was introduced into the film formation chamber. The gas pressure was kept at 0.2 Pa. A sputtering operation was carried out with an RF power of 2 KW. Thus, the TaSnON film was formed. With respect to the introduced gas, the flow rate of the argon was maintained at 30 sccm, and the flow rate of the oxygen was maintained at 5 sccm. The flow rate of the nitrogen was changed in increments of 5 sccm from 0 to 30 sccm. As a result, seven samples (A)–(G) was prepared as shown in Table 4.

The composition of each sample was analyzed, using an electron probe microanalyzer EPMA8705 manufactured by SHIMADZU CORPORATION, Japan, for the various elements, i.e., tantalum (Ta), tin (Sn), oxygen (O), and nitrogen (N), under the conditions listed in Tables 1 and 2.

TABLE 1

| | |
|---|---|
| accelerating voltage for electron beam | 15 KV |
| electrical current | 20 nA |
| size (diameter) of spot | 100 μm |
| count time | 10 sec |

TABLE 2

| | analyzing crystal | range |
|---|---|---|
| Ta-Mα | PET | ~7.247 Å |
| Sn-Lα | PET | ~3.602 Å |
| O-Kα | LSA | ~9.201 Å |
| N-Kα | LSA | ~12.294 Å |

In case the flow rate of nitrogen was 15 sccm or less, especially in a case of 10 sccm or less, it was difficult to detect nitrogen with the electron probe microanalyzer. Therefore, nitrogen was analyzed, using a secondary ion mass spectroscopy (SIMS) which is more sensitive than an electron probe microanalyzer.

In making analyses by SIMS, nitrogen was quantified by a quantification procedure using an ion-injecting sample such as a procedure described by R. G. Wilson, F. A. Stevie, and C. W. Magee in "Secondary Ion Mass Spectrometry", pp. 3.1–1 to 3.1–2. Sample A was formed in a gas atmosphere through which no nitrogen was flowed at all, and then, ions of nitrogen were implanted into the formed film at an accelerating voltage of 140 KeV so that a total dose of $1.0\times10^{15}$ $cm^{-2}$ was obtained. This sample A was used as a reference sample for quantification. For the analyses by SIMS, an ion mass spectroscopy IMS-4F manufactured by CAMECA corporation, France, was used. The seven samples (A)–(G) were analyzed under the conditions given in Table 3.

TABLE 3

| | |
|---|---|
| primary ion species | $CS^+$ |
| accelerating voltage | 10 KV |
| voltage applied across sample | −4.5 KV |
| ion current | 10 nA |
| beam diameter | 10 μm |
| polarity of secondary ions | negative |
| electron neutralizing gun | ON |
| scanning width | 125 μm□ |
| diameter of analyzed region | 56 μm |

The results of the analyses made in this way are given in Table 4.

TABLE 4

| sample | flow rate of nitrogen (sccm) | maximum storage charge ($\mu C/cm^2$) | value obtained by analysis (at %) Ta | Sn | O | N | N/Sn |
|---|---|---|---|---|---|---|---|
| A | 0 | 3.7 | 24.96 | 1.50 | 73.51 | 0.03 | 0.02 |
| B | 5 | 5.1 | 25.58 | 1.00 | 72.92 | 0.50 | 0.50 |
| C | 10 | 5.7 | 25.33 | 0.87 | 72.65 | 1.15 | 1.32 |
| D | 15 | 5.3 | 25.57 | 0.50 | 71.43 | 2.50 | 5.00 |
| E | 20 | 5.8 | 26.10 | 0.32 | 69.78 | 3.80 | 11.88 |
| F | 25 | 4.8 | 26.05 | 0.25 | 68.70 | 5.00 | 20.00 |
| G | 30 | 3.6 | 25.93 | 0.15 | 68.27 | 5.65 | 37.67 |

Figure 7:
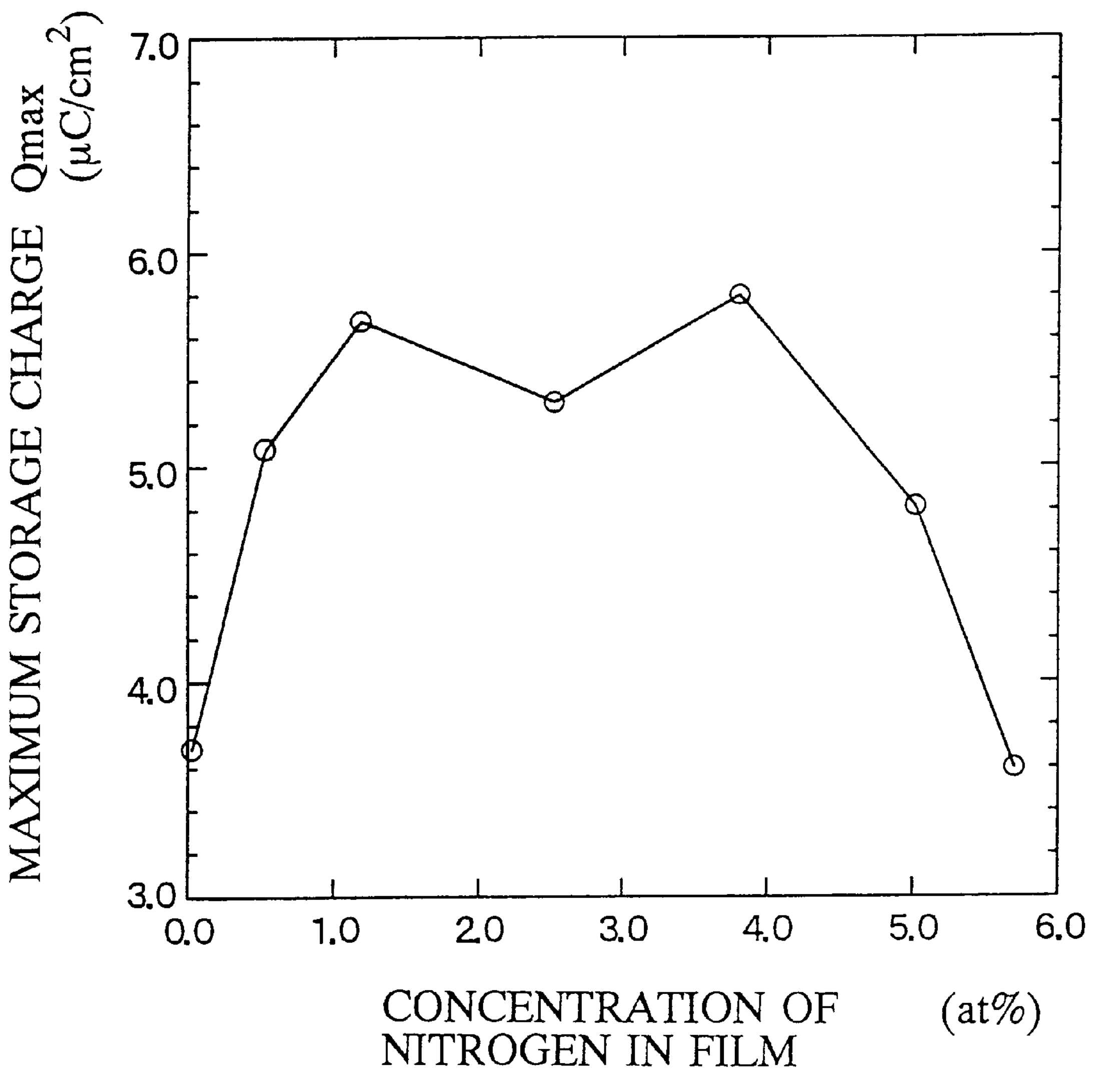
FIG. 7 is a graph showing the relationship of the maximum storage charge in a TaSnON film to the content (at %) of nitrogen atoms with respect to the total content of metal atoms in the TaSnON film.

The relation of the maximum storage charge Qmax to the percentage (at %) of nitrogen atoms contained in the TaSnON film was determined from the results given in Table 4. The relation is shown in FIG. 7, wherein data about the samples (A)–(G) are successively plotted from the left of the graph. It can be seen that when the percentage of the nitrogen atoms contained in the TaSnON film is approximately between 0.5 at % and 5.0 at %, quite high performance can be obtained.

The inventors consider that when the percentage of the amount of nitrogen atoms contained in the TaSnON film is less than 0.5 at %, the amount of nitrogen atoms is insufficient to provide desirable dielectric characteristics. Also, the inventors think that when the percentage of the amount of nitrogen atoms is in excess of 5.0 at %, tin (Sn) atoms cannot easily enter the structure, thus reducing the improvement of the dielectric characteristics.

Figure 8:
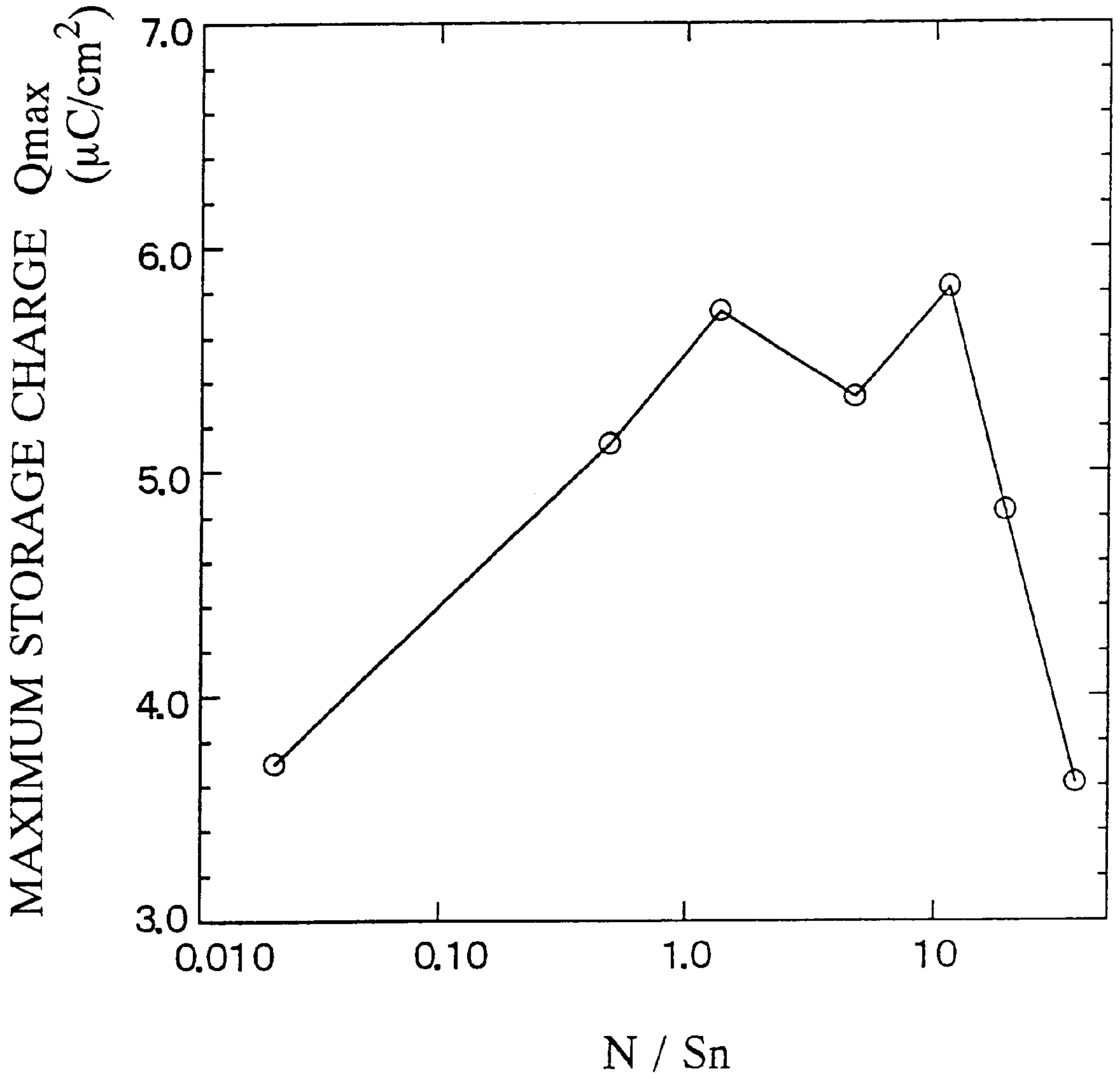
FIG. 8 is a graph showing the relationship of the maximum storage charge in the TaSnON film to the ratio (N/Sn) of nitrogen to tin in the film.

The relation between the maximum storage charge Qmax and the ratio of the amount of nitrogen (N) contained in the TaSnON film to the amount of tin (Sn) has been determined from the results listed in Table 4. The obtained results are shown in FIG. 8, wherein the ratio of the amount of nitrogen (N) to the amount of tin (Sn) is expressed logarithmically on the horizontal axis. Data about the samples (A)–(G) are plotted from the left successively.

As can be seen from the results shown in FIG. 8, a high performance can be obtained by setting the ratio N/Sn to a value between 0.1 and 20.0.

In the above-described embodiment, tin is used as an additive. Similar advantages can be derived from a case where indium (In) is used as an additive to form a TaInON film or a case where both tin and indium are used as additives to form a TaSnInON film.

Second Embodiment

Figure 9:
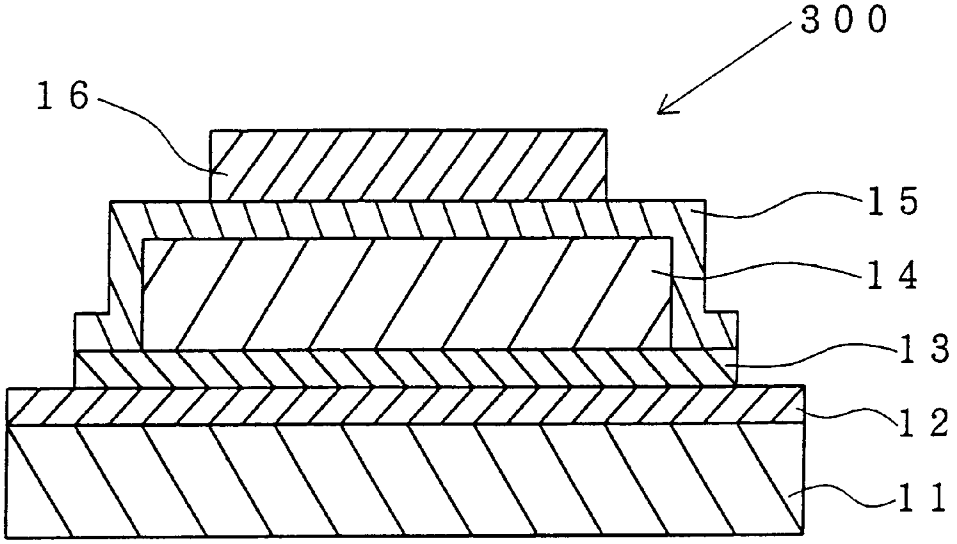
FIG. 9 is a cross-sectional view of a thin-film EL device showing a second embodiment of the invention.

FIG. 9 schematically shows the cross section of a thin-film EL device using the TaSnON film of the first embodiment as a dielectric film. The thin-film EL device, generally indicated by numeral 300, is formed by forming a first transparent electrode layer 12 composed of optically transparent ITO, a first dielectric layer 13 composed of optically transparent TaSnON, a luminescent layer 14 composed of zinc sulfide (ZnS) to which terbium (Tb) is added, a second dielectric layer 15 composed of optically transparent TaSnON, and a second transparent electrode layer 16 composed of optically transparent ITO in this order on an insulating substrate 11 consisting of non-alkali glass.

This thin-film EL device 300 is manufactured in the manner described below.

First, the first electrode layer 12 is formed on the non-alkali glass substrate 11. Specifically, the glass substrate 11 is heated to 350° C. and maintained at this temperature. A sputtering gas consisting of a mixture gas of argon (Ar) and oxygen ($O_2$) is introduced into a film formation chamber. The gas pressure is kept at 0.46 Pa. A sputtering operation is carried out with a DC power of 3.2 KW. At this time, a sintered mixture target obtained by mixing tin oxide ($SnO_2$) into indium oxide ($In_2O_3$) is used as a sputtering target. The film is deposited up to a thickness of, for example, 200 nm.

Then, the film is photolithographically patterned into desired stripes to form electrodes. At this time, a solution consisting mainly of hydrochloric acid (HCl) and ferric chloride ($FeCl_3$) is used as an etchant.

Subsequently, the first dielectric layer 13 is formed of TaSnON by sputtering techniques on the first electrode layer 12. In particular, the glass substrate 11 for the thin-film EL device 300 is heated to 300° C. and retained at this temperature. The inside of a film formation chamber is evacuated so that a pressure of $1.0\times10^{-4}$ Pa or less is achieved. Thereafter, a mixture gas comprising argon (Ar), 20 vol % nitrogen ($N_2$), and 5 vol % oxygen ($O_2$) is introduced into the film formation chamber. The gas pressure is kept at 0.2 Pa. A sintered mixture target consisting of tantalum oxide ($Ta_2O_5$) together with 10 mol % tin oxide ($SnO_2$) is used. A sputtering operation is effected with an RF power of 2 KW with a single target. The thickness of the formed film is, for example, 400 nm.

The luminescent layer 14 is formed on the first dielectric layer 13 by sputtering techniques. The luminescent layer (ZnS:Tb) 14 consists mainly of zinc sulfide (ZnS) to which terbium (Tb) is added as a luminescent center.

More specifically, the temperature of the glass substrate 11 is maintained at 250° C. The inside of the sputtering machine is evacuated to $1.0\times10^{-4}$ Pa or less. Then, a mixture gas comprising argon (Ar) and helium (He) is introduced into the film formation chamber. The gas pressure is 3.0 Pa. The sputtering operation is carried out with an RF power of 2.2 KW. The thickness of the formed film is, for example, 500 nm. Then, the film is heat-treated at 500° C. in a vacuum.

The second dielectric layer 15 made of TaSnON is formed on the luminescent layer 14 by the same method as used to form the first dielectric layer 13 up to a thickness of, for example, 400 nm. The second transparent electrode layer 16 is formed on the second dielectric layer 15 by the same method as used to form the first electrode layer 12 up to a thickness of, for example, 200 nm.

The thin-film EL device 300 was fabricated in the manner described above. Also, a thin-film EL device which was similar to the thin-film EL device 300 except that the dielectric layers 13 and 15 were made of silicon nitride oxide (SiON) was fabricated. Both kinds of EL devices were compared in terms of their performance.

Figure 10:
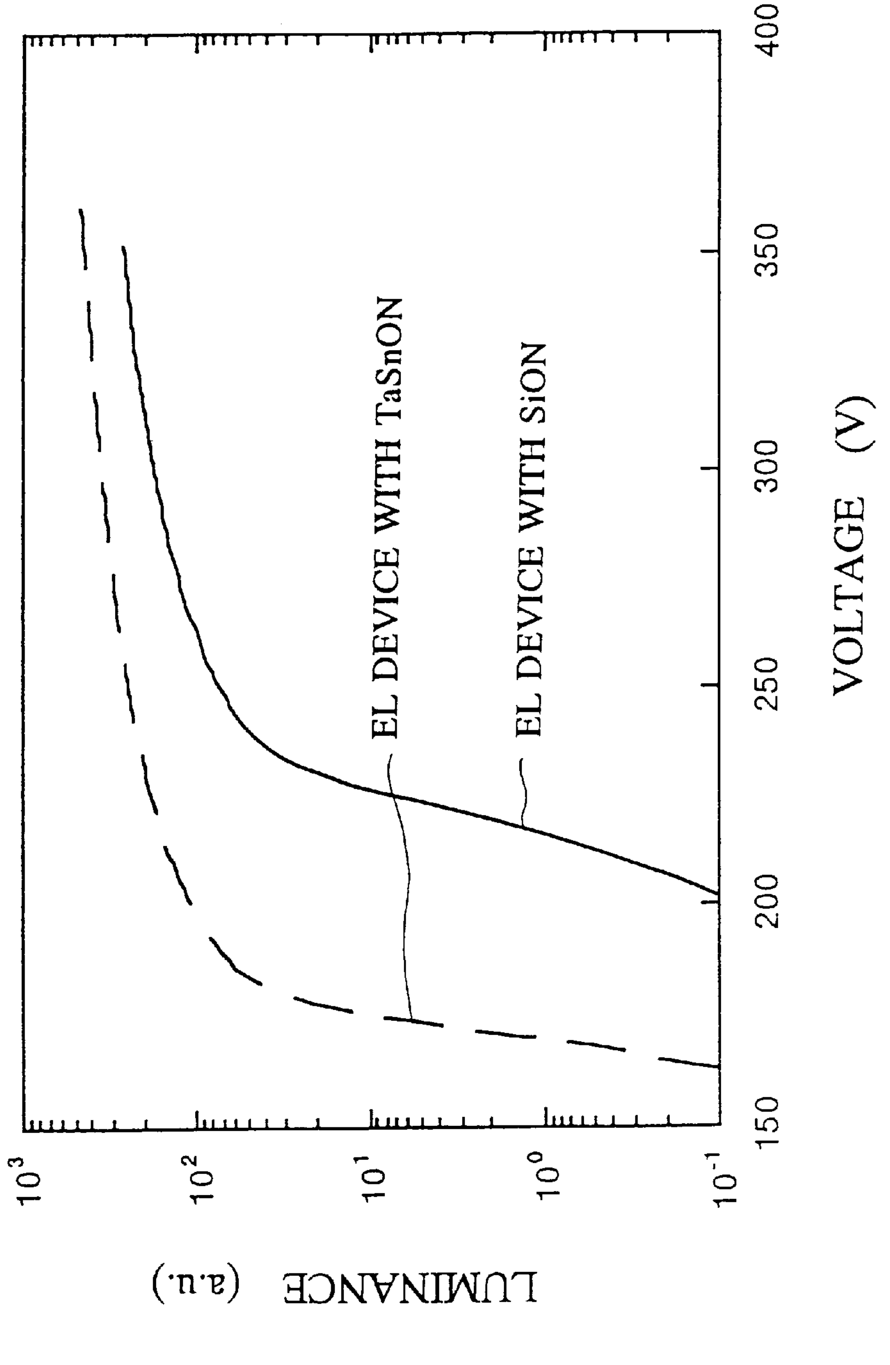
FIG. 10 is a graph showing the luminance characteristics of a thin-film EL device having dielectric layers of TaSnON and the luminance characteristics of a thin-film EL device having dielectric layers of SiON.

Both thin-film EL devices were operated while applying a sinusoidal wave voltage of 1 KHz. The obtained luminance characteristics are shown in FIG. 10. In this graph, the broken line shows the characteristic of the thin-film EL device 300 having a dielectric layer of TaSnON. The solid line shows the characteristic of the thin-film EL device having a dielectric layer of SiON. As can be seen from this graph, the driving voltage of the thin-film EL device having the dielectric layer of TaSnON can be made lower than that of the thin-film EL device having the dielectric layer of SiON, while obtaining a higher luminance. The thin-film EL device having the dielectric layer of TaSnON was subjected to a continuous luminescence durability test with an applied voltage of the luminescent threshold voltage +60 V. After the luminescence persisted for 1,000 hours, neither great damage to the whole pixel arrangement nor any propagating destruction occurred.

Furthermore, the sputtering method for forming the dielectric layer of TaSnON using a single target can more easily provide great area than the film formation method using a multiple element-source target and is adapted for mass production.

Third Embodiment

Figure 11:
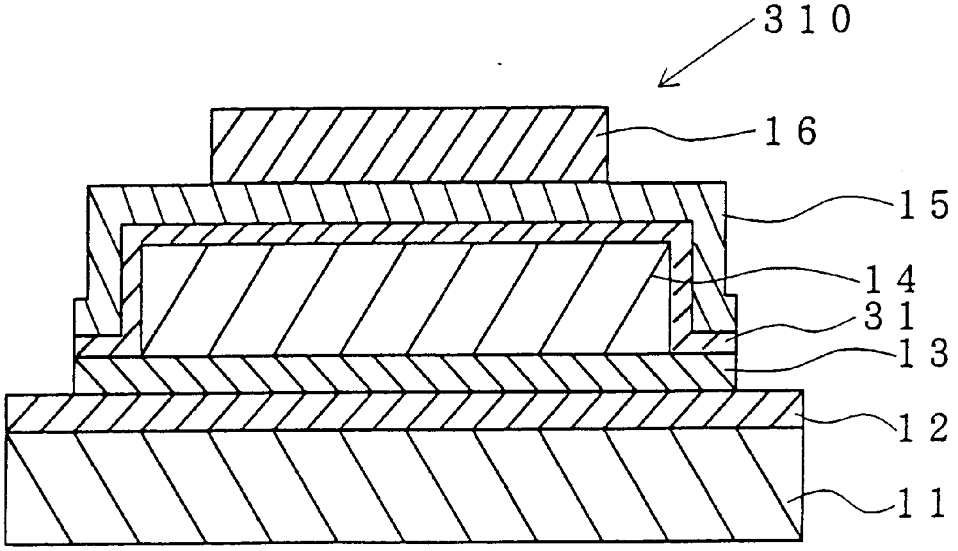
FIG. 11 is a cross-sectional view of another thin-film EL device showing a third embodiment of the invention.

In case the dielectric layers of TaSnON of the above-described thin-film EL device 300 and other dielectric layers are laminated together, similar advantages can be obtained. This example is shown as a thin-film EL device 310 in FIG. 11. This thin-film EL device 310 comprises a luminescent layer 14 and a dielectric layer formed on it. This upper dielectric layer has a two-layer structure consisting of an SiON film 31 and a TaSnON film 15 formed on the SiON film 31. The thin-film EL device 310 is similar in structure with the thin-film EL device 300 except for the SiON film 31. The thickness of the SiON film 31 is, for example, 50 nm.

Figure 12:
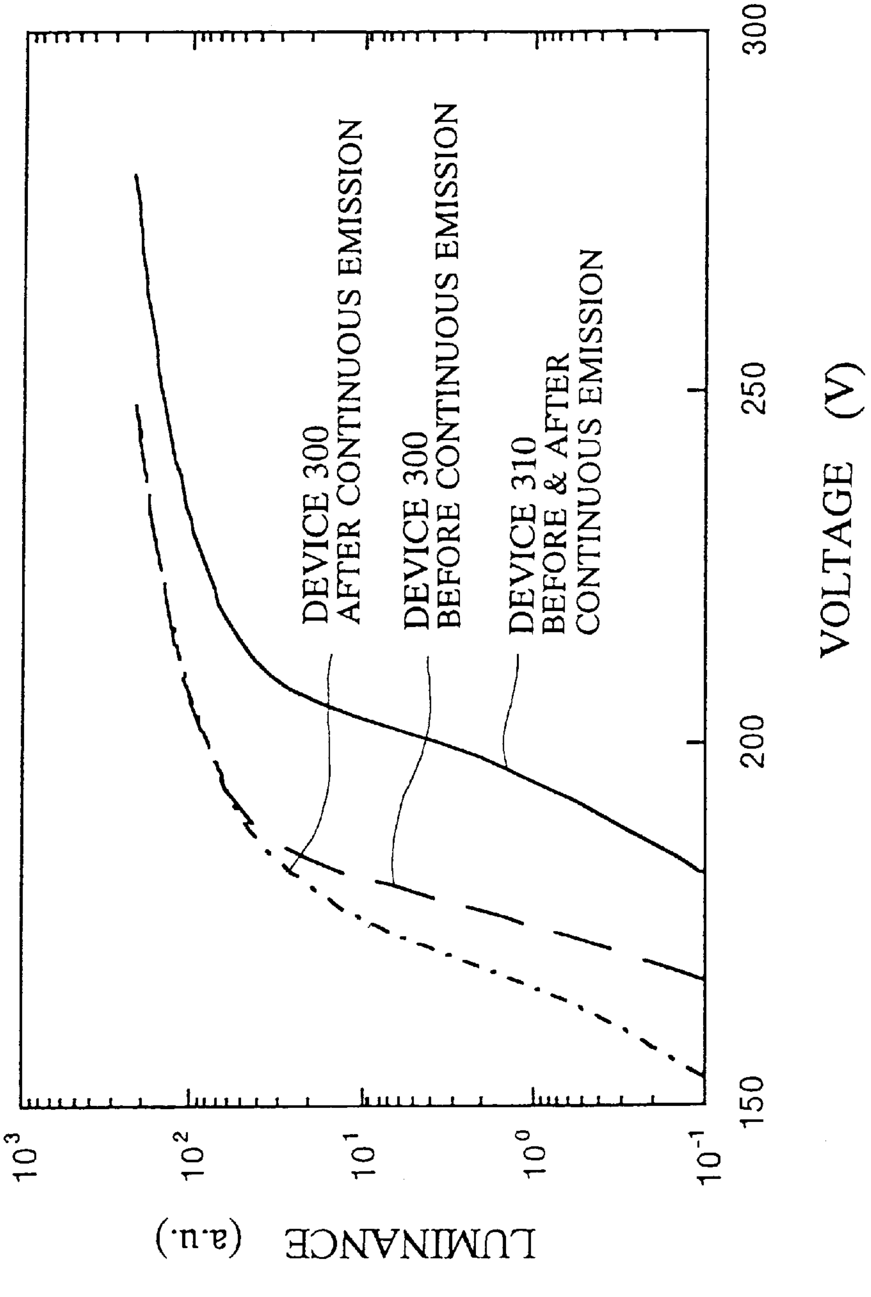
FIG. 12 is a graph showing the luminance characteristics obtained before and after continuous luminescence of the thin-film EL device (second embodiment) 300 and the thin-film EL device (third embodiment) 310.

FIG. 12 shows the luminance characteristics of the thin-film EL device 300 (FIG. 9) and the thin-film EL device 310 (FIG. 11) before and after their continuous luminescence. As can be seen from this graph, the luminescent threshold voltage of the thin-film EL device 310 does not vary and is more stable. Furthermore, the number of destroyed pixels in the thin-film EL device 310 after the continuous luminescence test is fewer.

A $SiN_x$ film may be used instead of the SiON film 31.

Fourth Embodiment

Figure 13:
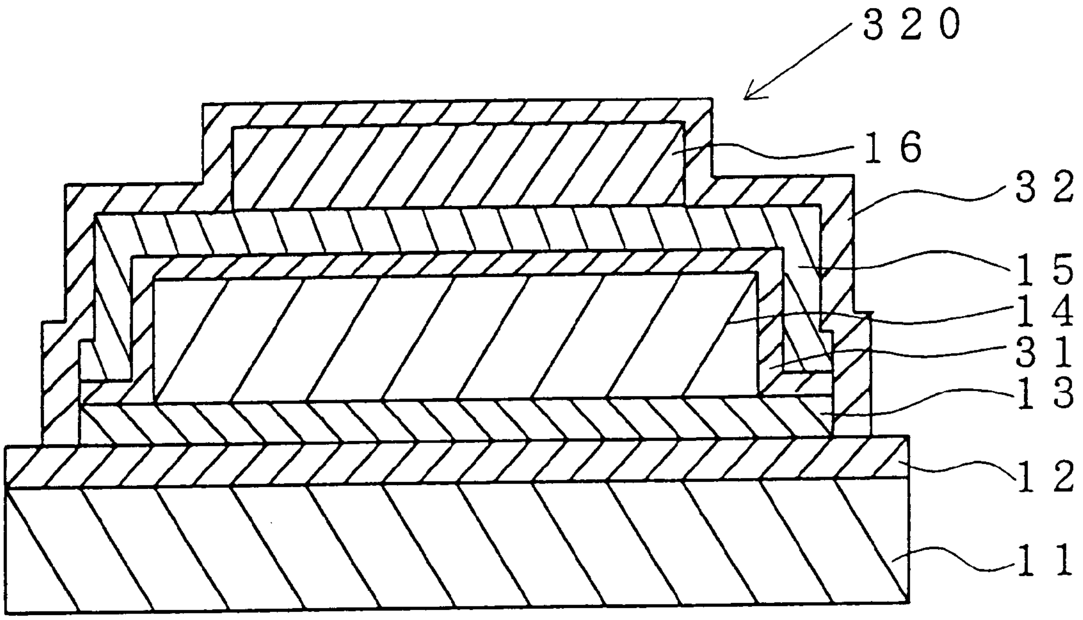
FIG. 13 is a cross-sectional view of a further thin-film EL device showing a fourth embodiment of the invention.

Referring to FIG. 13, there is shown a thin-film EL device 320 which is similar to the above-described thin-film EL device 310 except that a moisture-proof passivation film 32 is formed on the second electrode layer 16. This passivation film 32 is made of TaSnON. This TaSnON film 32 is fabricated under the same condition as the dielectric layers 13 and 15 of TaSnON.

The first electrode layer 12 and the second electrode layer 16 of the thin-film EL device 320 are made of ITO. However, the electrical resistances of the first electrode layer 12 and the second electrode layer 16 are not increased. Also, the TaSnON film 32 provides good moisture-proof characteristics. Application of this passivation film 32 is not limited to the third embodiment described above. The passivation film 32 can also be applied to the second embodiment described above.

Other Embodiments

It is to be understood that the invention is not limited to a thin-film EL device wherein the dielectric layers 13 and 15 are formed on each side of the luminescent layer 14. The dielectric layer composed of TaSnON may also be formed on only one side of the luminescent layer while the other side dielectric layer is composed of other dielectric substances. Furthermore, it is not required that both electrode layers 12 and 16 be transparent. Only the electrode layer on the luminescence exit side may be transparent.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of fabricating a thin film electroluminescent device having a luminescent layer and a dielectric layer both of which are disposed between a pair of electrode layers, said method comprising:

preparing a sputtering target formed essentially of tantalum oxide together with at least one of indium oxide and tin oxide; and sputtering said sputtering target in an atmosphere of a mixture of gas including argon, oxygen, and nitrogen to form said dielectric layer, whereby said dielectric layer, which is an amorphous thin film including tantalum, oxygen, nitrogen and at least one of indium and tin, is deposited.

2. A method of fabricating a thin-film electroluminescent device according to claim 1, including fabricating said sputtering target by mixing tantalum oxide with at least one of indium oxide and tin oxide and sintering a mixture.

3. A method of fabricating a thin-film electroluminescent device according to claim 1, including controlling said sputtering at a pressure of 0.3 Pa or less.

4. A method of fabricating a thin-film electroluminescent device according to claim 1, including forming at least one of said electrode layers, that is a transparent conductive film, from indium oxide and tin oxide; and forming said dielectric layer on said transparent conductive film.

5. A method of fabricating a thin-film electroluminescent device according to claim 4, including controlling said mixture gas atmosphere during said sputtering so that nitrogen gas accounts for at least 5% by volume of said mixture gas atmosphere.

6. A method of fabricating a thin-film electroluminescent device according to claim 5, wherein:

a total of oxygen gas and nitrogen gas accounts for less than 50% by volume of said mixture gas atmosphere; and the volume percent of oxygen is not in excess of the volume percent of nitrogen.

7. A method of fabricating a thin-film electroluminescent device according to any one of claims 1 to 6, including depositing said dielectric layer on a substrate by sputtering said sputtering target when said substrate is heated.

8. A method of fabricating a thin-film electroluminescent device according to claim 7, including depositing said dielectric layer while a temperature of said substrate is approximately 300° C.

* * * * *